United States Patent
P. Junqueira De Andrade et al.

(10) Patent No.: US 10,396,790 B1
(45) Date of Patent: Aug. 27, 2019

(54) STATE CONTROL OF A DIGITAL LOGIC CIRCUIT WITHIN AN INTEGRATED CIRCUIT DURING LOW POWER MODE

(71) Applicant: NXP USA, INC., Austin, TX (US)

(72) Inventors: Luis Francisco P. Junqueira De Andrade, Campinas (BR); Ivan Carlos Ribeiro Do Nascimento, Campinas (BR); Armando Gomes Da Silva, Jr., Campinas (BR); Marcos Da Costa Barros, Santa Barbara d'Oeste (BR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/152,611

(22) Filed: Oct. 5, 2018

(51) Int. Cl.
*H03K 19/003* (2006.01)
*H03K 19/0185* (2006.01)
*H03K 21/38* (2006.01)

(52) U.S. Cl.
CPC . *H03K 19/00323* (2013.01); *H03K 19/00384* (2013.01); *H03K 19/01855* (2013.01); *H03K 19/018521* (2013.01); *H03K 21/38* (2013.01)

(58) Field of Classification Search
CPC ....... H03K 19/00323; H03K 19/00384; H03K 19/018521; H03K 19/01855; H03K 21/38
See application file for complete search history.

(56) References Cited

U.S. PATENT DOCUMENTS

| | | | | |
|---|---|---|---|---|
| 6,204,713 B1 * | 3/2001 | Adams | ...................... | G06F 1/10 327/293 |
| 6,396,324 B1 * | 5/2002 | Hsu | ........................... | G06F 1/04 327/298 |
| 6,785,826 B1 * | 8/2004 | Durham | ................ | G06F 1/3203 713/300 |
| 6,845,454 B2 * | 1/2005 | Kim | ......................... | G06F 1/04 713/300 |
| 7,284,143 B2 * | 10/2007 | Song | ........................ | G06F 1/10 327/141 |
| 7,370,132 B1 * | 5/2008 | Huang | ................ | G06F 13/4018 710/305 |

(Continued)

OTHER PUBLICATIONS

Chakraborty, Ashutosh, et al.; "Analysis and Optimization of NBTI Induced Clock Skew in Gated Clock Trees;" 2009 Design, Automation & Test in Europe Conference & Exhibition; Apr. 20-24, 2009, Nice, France; DOI: 10.1109/DATE.2009.5090675.

(Continued)

*Primary Examiner* — Alexander H Taningco
*Assistant Examiner* — Kurtis R Bahr

(57) ABSTRACT

An integrated circuit includes a digital logic circuit, a multiplexer (MUX) having a first and a second data input, a control input, and an output coupled to an input of the digital logic circuit. The second data input is coupled to receive a high frequency clock signal. The integrated circuit includes a very low frequency (VLF) clock is configured to provide a VLF clock signal when enabled, and a counter coupled to receive the VLF clock signal and configured to toggle an output of the counter upon counting a predetermined number of cycles of the VLF clock signal. The output of the counter is coupled to the first data input of the MUX. The MUX is configured to provide the first data input as the output of the MUX during a low power mode, and otherwise to provide the second data input as the output of the MUX.

18 Claims, 3 Drawing Sheets

(56) References Cited

U.S. PATENT DOCUMENTS

| | | | |
|---|---|---|---|
| 7,948,261 B2* | 5/2011 | Kawakami | H03K 19/00369 |
| | | | 326/12 |
| 8,008,949 B1* | 8/2011 | Kallam | G06F 1/08 |
| | | | 327/298 |
| 9,214,924 B2 | 12/2015 | Priel et al. | |
| 9,625,980 B2* | 4/2017 | Cosaro | G06F 1/3287 |
| 2011/0102043 A1* | 5/2011 | Zerbe | G06F 1/10 |
| | | | 327/261 |

OTHER PUBLICATIONS

Khoshavi, Navid et al.; "Applicability of Power-gating Strategies for Aging Mitigation of CMOS Logic Paths;" IEEE 57th International Midwest Symposium on Circuits and Systems (MWSCAS); Aug. 3-6, 2014, College Station, Texas; DOI: 10.1109/MWSCAS.2014.6908568.

Maricau, E., et al.; "NBTI Model for Analog IC Reliability Simulation;" Electronics Letters vol. 46, Issue 18, Sep. 9, 2010; ISSN: 0013-5194; DOI: 10.1049/el.2010.1.

U.S. Appl. No. 16/146,435; Inventors: Ivan Carlos Ribeiro Do Nascimento, et al.; "Static State Control of a Digital Logic Circuit Within an Integrated Circuit During Low Power Mode;" filed Sep. 28, 2018.

\* cited by examiner

US 10,396,790 B1

STATE CONTROL OF A DIGITAL LOGIC CIRCUIT WITHIN AN INTEGRATED CIRCUIT DURING LOW POWER MODE

BACKGROUND

Field

This disclosure relates generally to integrated circuits, and more specifically, to state control in the integrated circuit during low power mode to address Bias Temperature Instability (BTI) ageing.

Related Art

Reliability of Metal-Oxide-Semiconductor (MOS) transistors becomes more critical as channel length continues to decrease. For these transistors, such as those with tenths of nanometers channel length, there are four common reliability issues, including high current injection (HCI), time dependent dielectric breakdown (TDDB), negative bias temperature instabilities (NBTI), and positive bias temperature instabilities (PBTI). Referring to both NBTI and PBTI, MOS transistors are affect by bias temperature instability (BTI) when they are biased with a direct-current (DC) voltage in their gate without a drain current (without a lateral electric field inside the channel). Generally, PBTI affects NMOS transistor while NBTI affects PMOS transistors.

During BTI stress, charges are trapped in the dielectric of the MOS gate, which makes the absolute value of the threshold voltage (Vth) increase. That is, the Vth of NMOS transistors is increased, and the Vth of PMOS transistors is decreased. Some part of this BTI degradation can be recovered when the stress is removed, therefore, BTI impact is more important during rest periods of a circuit as opposed to switching periods.

For example, FIG. 1 illustrates a clock distribution circuit 100 of an integrated circuit, which includes a chain of series connected inverters 104-114, and a NAND gate 102 which controls the switching of the inverter chain. When the enable signal, EN, at one input of NAND gate 102 is a logic level 1, the inverter chain switches in accordance with an oscillating input, OSC, at another input of NAND gate 102. However, when EN is disabled, or a logic level 0, the logic values remain fixed, as illustrated in FIG. 1. That is the output of NAND gate 102 remains a logic level 1, the output of inverter 104 remains a logic level 0, the output of inverter 105 remains a logic level 1, and so on. Since an inverter is formed by a PMOS in series with an NMOS between power and ground, the PMOS transistor is stressed in those inverters with a 0 at the input (e.g. inverters 105, 107, 109, 111, and 113) while the NMOS transistor is stressed in those inverters with a 1 at the input (e.g. inverters 104, 106, 108, 110, 112, and 114).

The stress on the NMOS transistors result in an extra delay on the falling edge of the output of the inverter, and the stress on the PMOS transistors result in an extra delay on the rising edge of the output of the inverter. This results in deteriorating the clock duty cycle, resulting in errors in those circuits coupled to the output of clock distribution circuit 100. MOS transistors in any logic which becomes static suffer these BTI effects. Therefore, a need exists to balance BTI ageing of transistors so as to reduce failures in an integrated circuit.

BRIEF DESCRIPTION OF THE DRAWINGS

The present invention is illustrated by way of example and not limited by the accompanying figures, in which like references indicate similar elements. Elements in the figures are illustrated for simplicity and clarity and have not necessarily been drawn to scale.

DETAILED DESCRIPTION

In one aspect, during a low power mode, a low frequency signal is provided as an input to a digital logic circuit which would otherwise remain static during the low power mode. This balances BTI ageing in the logic circuit. For example, the digital logic circuit may be a clock distribution circuit which includes a chain of series connected inverters. In this example, during the low power mode, when the low frequency signal is at a low logic state, BTI stress is applied to the PMOS transistors of odd stages and to the NMOS transistors of even stages of the clock distribution circuit. Similarly, when the low frequency signal is at a high logic state, BTI stress is applied to the NMOS transistors of the odd stages and to the PMOS transistors of the even stages. While a transistor is not under stress, it has time recover from a previous stress cycle of the low frequency clock. Since the low frequency clock may be interrupted during low power mode, a counter is used to maintain a count of the low frequency clock to ensure that the time in each of the stressed states within the logic circuit is balanced no matter the duration of the low power mode periods. In the example of the clock distribution circuit, this makes all transistors of all stages equally stressed to maintain a balanced duty cycle.

Figure 1:
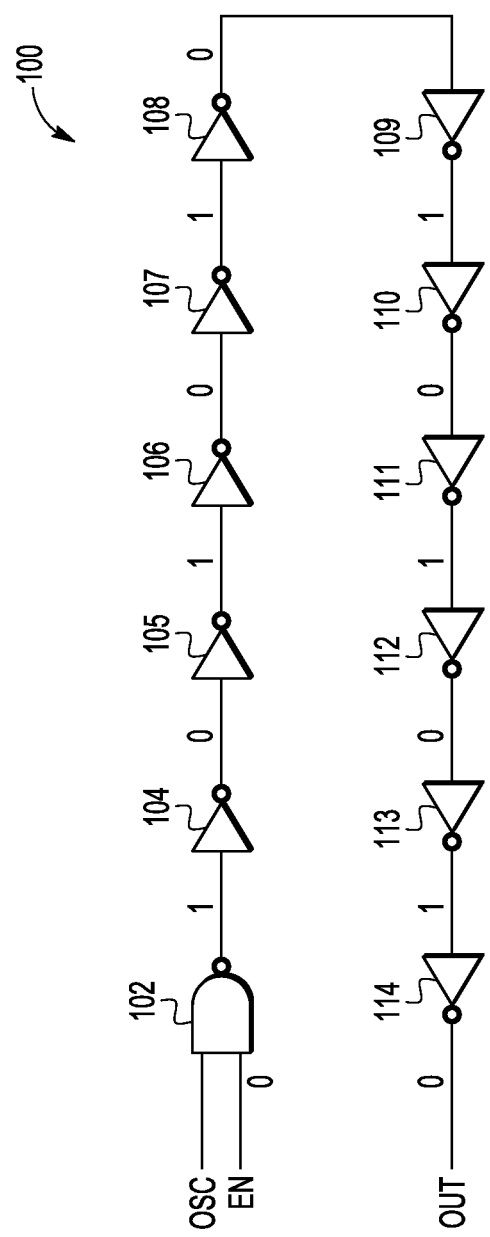
FIG. 1 illustrates a clock distribution circuit in accordance with the prior art.
Figure 2:
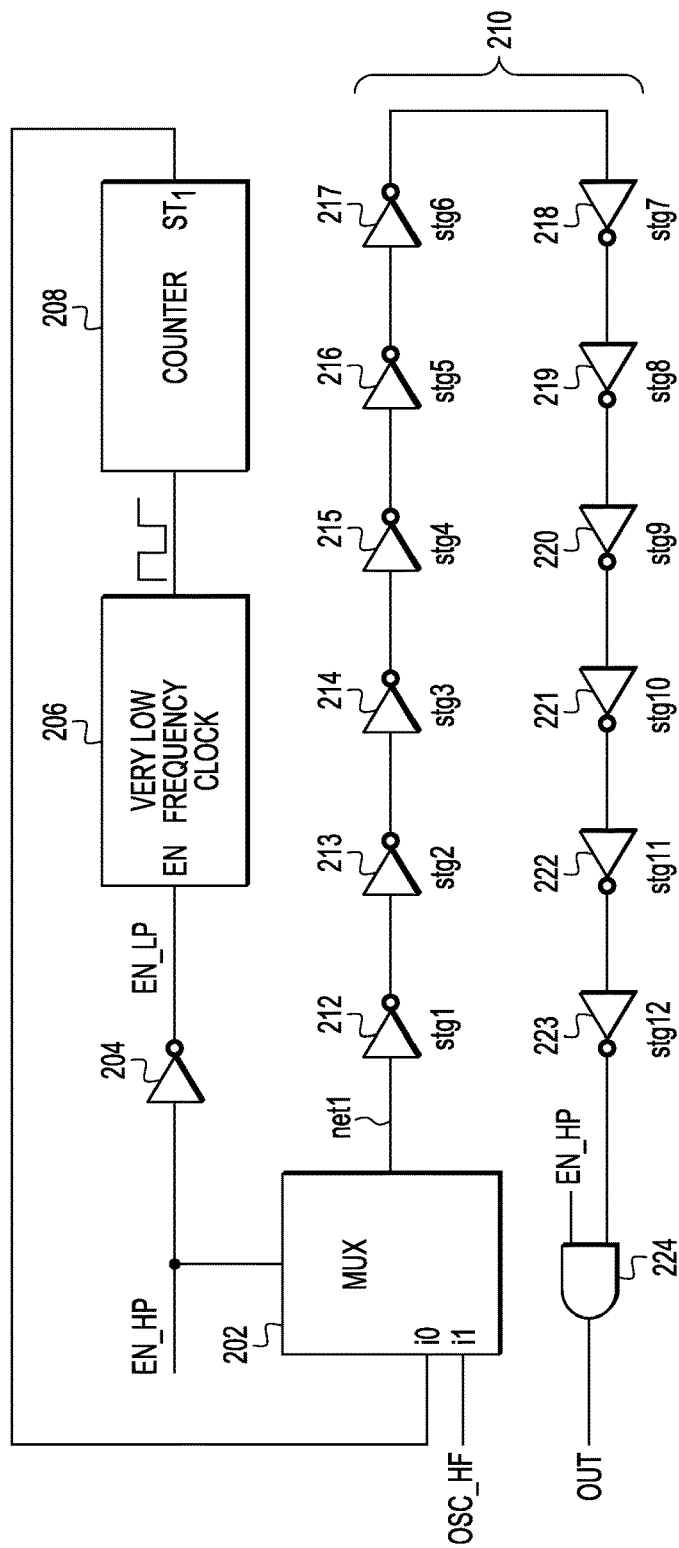
FIG. 2 illustrates a clock distribution circuit in accordance with one embodiment of the present invention.

FIG. 2 illustrates, in partial block diagram and partial schematic form, a clock distribution circuit 200 including a multiplexer (MUX) 202, an inverter 204, a very low frequency (VLF) clock 206, and a counter 208, a chain of inverters 210 (including inverters 212-223 having 12 stages, stg1-stg12), and a masking AND gate 224. Note that the chain of inverters 210 is a digital logic circuit which becomes static during low power modes and thus suffer from BTI effects. However, the chain of inverters 210 is only one example of such a digital logic circuit, and the descriptions which follow of MUX 202, VLF clock 206, and counter 208 can be used to mitigate the BTI effects of any digital logic circuit which would otherwise become static during low power modes.

Referring to FIG. 2, MUX 202 has a first data input i0, a second data input i1, a data output, and a control input which allows selection between i0 and i1 to be provided at the data output. When the control input receives a logic level zero, i0 is selected as the output of MUX 202, when the control input receives a logic level 1, i1 is selected as the output of MUX 202. The control input of MUX 202 and an input of inverter 204 are coupled to receive a high power mode enable, EN_HP, which enables operation in normal, or high power, mode when asserted. An output of inverter 204 provides a low power mode enable, EN_LP, to an enable input of VLF clock 206. EN_LP, when asserted, enables operation in a lower power mode and enables VLF clock 206 to provide a VLF clock signal. The VLF clock signal is provided to an input of counter 208. Counter 208 counts cycles of the VLF clock signal. When the number of cycles reaches a predetermined threshold (3, in one example), counter 208 toggles its output, which is provided to input i0 of MUX 202, and resets its count value.

A high frequency clock, OSC_HF, is provided to input i1 of MUX 202. OSC_HF is high frequency clock which is used during normal (higher power) mode. Therefore, the frequency of the VLF clock signal is much lower than the frequency of OSC_HF. In one embodiment, the frequency is at least $10^5$ times slower (i.e. 5 orders of magnitude slower), or alternatively, at least $10^6$ times slower (i.e. 6 orders of magnitude slower). It is common to stop the clocks during low power operation to avoid dynamic power consumption, and by choosing a very low frequency for VLF clock 206 (such as $10^6$ times slower), dynamic power consumption of this VLF clock becomes negligible. Masking AND gate 224 has a first input coupled to receive EN_HP, a second input coupled to an output of chain of inverters 210, and an output, OUT, which masks the low frequency toggling caused by VLF clock 206 during low power mode.

In operation, when in a high power mode or run mode, EN_HP is asserted, selecting OSC_HF (at i1) to be provided by MUX 202 to chain of inverters 210. The output of chain 210 is provided as OUT via AND gate 224. Since EN_HP is at a logic level one when in high power mode, the output of inverter 223 is provided as OUT, unmasked. The output of chain 210 distributes the OSC_HF clock at its frequency to other circuits of the integrated circuit coupled to receive OUT.

When in low power mode, EN_HP is deasserted and the output of counter 208 (at i0) is provided by MUX 202 to chain of inverters 210. Also, EN_LP is asserted, enabling VLF clock 206 to provide the VLF clock signal to counter 208. Each time the count value of counter 208 reaches the predetermined threshold (three, as an example), counter 208 toggles its output which is provided by MUX 202 to the input of inverter 212 and resets its count value back to 0. The toggling of counter 208 propagates state changes throughout inverter chain 210, up to the second input of AND gate 224. While in low power mode, though, EN_HP is deasserted to a logic level 0, thus masking the output of inverter 223 to a logic level low. This masks the toggling of chain 210. However, in alternate embodiments, masking AND gate 224 may not be present.

In low power mode, while the output of counter 208 remains at a first logic level, e.g. logic level 0, the BTI stress is placed on PMOS transistors of odd stages (e.g., of inverters 212, 214, 216, 218, 220, and 222, corresponding to stg1, stg3, stg5, etc.) and on NMOS transistors of even stages (e.g. of inverters 213, 215, 217, 219, 221, and 223, corresponding to stg2, stg4, stg6, etc.). When the output of counter 208 toggles to a second logic level, e.g. logic level 1, the BTI stress is placed on PMOS transistors of even stages and the NMOS transistors of odd stages. When transistors are not being stressed, they have time to recover until the next toggling of counter 208. That is, the transistors previously under stress are no longer under stress in a subsequent cycle and may recover from earlier BTI stress. Operation of clock distribution circuit 200 will be described in more detail in reference to FIG. 3.

Figure 3:
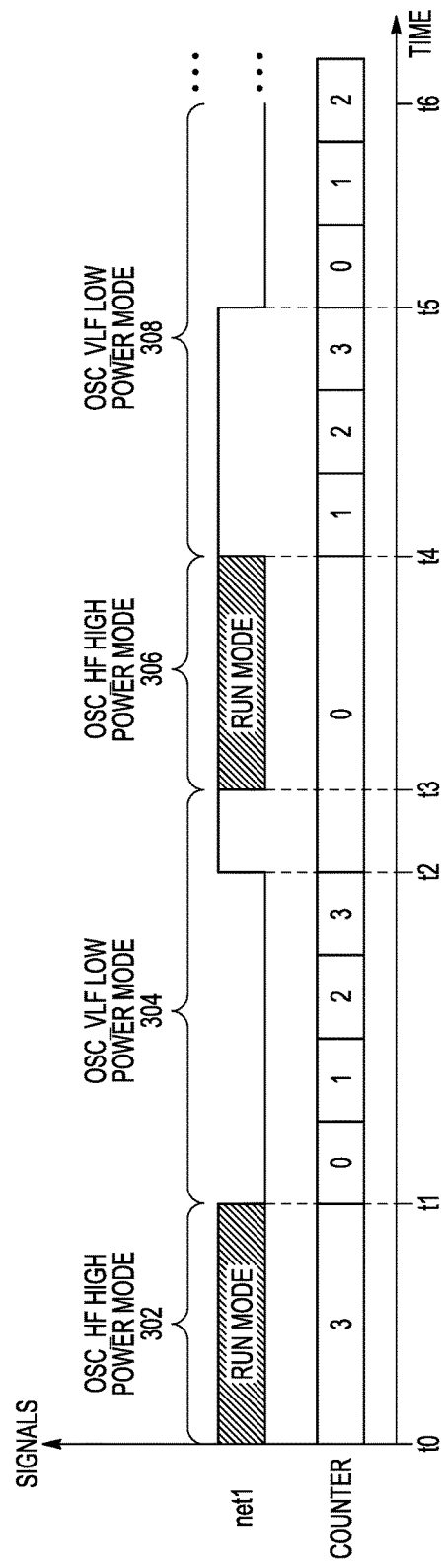
FIG. 3 illustrates, in timing diagram form, signals for the circuit of FIG. 2, in accordance with one embodiment of the present invention.

FIG. 3 illustrates a timing diagram which illustrates the operation of VLF clock 206 and counter 208 on net1 of FIG. 2 over a time of t0 to t6, in which net1 represents the input to chain of inverters 210 (at inverter 212 of stg1). Note that in alternate embodiments, in logic circuits other than chain 210 of a clock distribution circuit, net1 refers to any input of the logic circuit which receives the output of a counter, such as counter 208, which operates based on a VLF clock, such as VLF clock 206. Note that these logic circuits would otherwise remain static during low power mode if not provided with the toggling counter output. That is, if these logic circuits were not provided a varying input during low power mode, they would remain static.

FIG. 3 includes four different example periods: OSC_HF high power mode 302 and 306, and OSC_VLF low power mode 304 and 308. In OSC_HF high power modes, the higher frequency OSC_HF clock signal is used as an input to net1, and net1 operates in run mode (also referred to as normal mode). In the OSC_LF low power modes, the much lower frequency VLF clock signal is used to control toggling of counter 208, which is provided as the input to net1. When operating in low power mode, net1 may be interrupted to return to run mode. In the example of FIG. 3, it is assumed that counter 208 counts from 0 to 3 (corresponding to 4 cycle counts) to toggle its output and resets to 0 after each toggle.

At time t0, net1 is operating in OSC_HF high power mode. At the time net1 entered this high power mode, counter 208 was at count value 3 with its output at a logic level one. At time t1, net1 enters OSC_VLF low power mode in which counter 208, which has reached 3, toggles its output to a logic level 0 (provided as net1) and continues counting starting again with 0. Counter 208 completes its full count to 3 while still in low power mode period 304. During period 304, counter 208, at time t2, transitions from 3 to 0 and again toggles its output to a logic level 1 (provided as net1). At time t3, the low power mode is interrupted so as to enter run mode. OSC_HF high power mode period 306 continues until time t4. At time t3 when period 306 began, the count value of counter 308 was still at 0, and this value is maintained during the high power mode period 306. That is, during high power mode, the count value of counter 208 is preserved until low power mode is again entered, at which point counter 208 continues counting from its preserved count value. Therefore, at time t4, net1 again enters low power mode, in which the output of counter 208 remains at a logic level high and continues counting by transitioning from 0 to 1. During low power mode period 308, counter 208 reaches 3 and therefore, at time t5, the output of counter 208 toggles back to a logic level 0 and counter 208 is reset.

By using counter 208 controlled by VLF clock 206 to ensure that the input to the digital logic circuit (e.g. net1) only toggles after 4 cycles of the VLF clock signal, all devices in each stage of the logic circuit are equally stressed and equally allowed to recover. Further, the use of the counter maintains the current VLF clock cycle count even if interrupted. In the case of clock distribution circuit 200, this stress balancing results in a balanced duty cycle. By allowing groups of transistors in a digital logic circuit to toggle states in accordance with a VLF clock, the groups of transistors can equally alternate between suffering BTI stress and recovering from BTI stress in a balanced manner. In this way, the effects of BTI stress in digital logic circuits within an integrated circuit can be mitigated and allow for improved circuit operation, even as the integrated circuit ages.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a "b" following the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the MUX, VLF clock, and counter may be used mitigate and balance BTI stress effects in any logic circuit and not only clock distribution circuits. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes a digital logic circuit; a multiplexer (MUX) having a first data input, a second data input, a control input, and an output, wherein the output is coupled to an input of the digital logic circuit, the second data input is coupled to receive a high frequency clock signal; a very low frequency (VLF) clock configured to provide a VLF clock signal when enabled, wherein the VLF clock signal has a lower frequency than a frequency of the high frequency clock signal; and a counter coupled to receive the VLF clock signal and configured to toggle an output of the counter upon counting a predetermined number of cycles of the VLF clock signal, wherein the output of the counter is coupled to the first data input of the MUX, wherein the MUX is configured to provide the first data input as the output of the MUX during a low power mode, and otherwise to provide the second data input as the output of the MUX. In one aspect of the embodiment, the frequency of CLF clock signal is at least $10^6$ times slower than the frequency of the high frequency clock signal. In another aspect, the control input of the MUX is coupled to receive a high power mode enable signal which, when asserted, enables a high power mode. In a further aspect, an enable input of the VLF clock is coupled to receive a low power mode enable signal which, when asserted, enables the lower power mode. In another further aspect, during the high power mode, the MUX is configured to provide the second data input as the output of the MUX. In another aspect of the embodiment, the digital logic circuit comprises a chain of series connected inverters. In a further aspect, the integrated circuit further includes a masking gate coupled to an output of the chain of series connected inverters which is configured to mask toggling of the output of the chain of series connected inverters during the low power mode. In another aspect, during the low power mode, when the counter output is at a first logic level, stress is placed on a first set of transistors of the digital logic circuit. In a further aspect, during the low power mode, when the counter output is at a second logic level, stress is placed on a second set of transistors of the digital logic circuit, wherein the first set and second set of transistors are mutually exclusive. In another further aspect, during the low power mode, when the counter output is at a first logic level, the second set of transistors recovers from stress and when the counter output is at the second logic level, the first set of transistors recovers from stress. In another aspect, during the low power mode, in the absence of a varying input signal at the input of the digital logic circuit, states of the digital logic circuit remains static. In another aspect, the digital logic circuit is characterized as a clock distribution circuit. In yet another aspect, during interruption of the low power mode, the counter is configured to maintain a same count value until low power mode is re-entered.

In another embodiment, a method includes, during a high power mode, providing a high frequency clock signal to an input of a digital logic circuit; during a lower power mode: providing a very low frequency (VLF) clock signal to a counter, wherein the VLF clock signal has a lower frequency than a frequency of the high frequency clock signal by at least 5 orders of magnitude; toggling an output of the counter upon counting a predetermined number of cycles of the VLF clock signal; and providing the output of the counter to the input of the digital logic circuit instead of the high frequency clock signal. In one aspect of the another embodiment, the method further includes interrupting the low power mode, wherein during the interruption, the counter maintains a count value present in the counter when the interruption occurred; and after interrupting the low power mode, re-entering the low power mode and continuing to count cycles of the VLF clock signal starting from the maintained count value. In a further aspect, during the high power mode, disabling the counter from counting cycles of the VLF clock signal. In another aspect, during the lower power mode, when the output of the counter has a first logic level, stress is placed on a first set of transistors of the digital logic circuit, and when the output of the counter has a second logic level different from the first logic level, stress is placed on a second set of transistors of the digital logic circuit, wherein the first set and second set of transistors are mutually exclusive. In a further aspect, during the low power mode, when the output of the counter is at a first logic level, the second set of transistors recovers from stress and when the output of the counter is at the second logic level, the first set of transistors recovers from stress.

In yet another embodiment, an integrated circuit includes a digital logic circuit; a multiplexer (MUX) having a first data input, a second data input coupled to receive a high frequency clock signal, a control input, and an output, wherein: the output of the MUX is coupled to an input of the digital logic circuit, and the MUX is configured to provide the first data input as the output of the MUX during a low power mode and the second data input as the output of the MUX during a high power mode; a very low frequency (VLF) clock configured to provide a VLF clock signal when in the low power mode, wherein the VLF clock signal has a frequency that is at least 5 orders of magnitude less than a frequency of the high frequency clock signal; and a counter coupled to receive the VLF clock signal and configured to toggle an output of the counter during the lower power mode upon counting a predetermined number of cycles of the VLF clock signal, wherein the output of the counter is coupled to the first data input of the MUX, and wherein when an interruption of the low power mode occurs, the counter is configured to maintain a count value during the interruption such that upon re-entering the low power mode, the counter is configured to continue counting from the maintained count value. In a further aspect, during the low power mode, when the counter output is at a first logic level, stress is placed on a first set of transistors of the digital logic circuit, and when the counter output is at a second logic level, different from the first logic level, stress is placed on a second set of transistors of the digital logic circuit, wherein the first set and second set of transistors are mutually exclusive.

What is claimed is:

1. An integrated circuit, comprising:
   a digital logic circuit;
   a multiplexer (MUX) having a first data input, a second data input, a control input, and an output, wherein the output is coupled to an input of the digital logic circuit, the second data input is coupled to receive a high frequency clock signal;
   a very low frequency (VLF) clock configured to provide a VLF clock signal when enabled, wherein the VLF clock signal has a lower frequency than a frequency of the high frequency clock signal; and
   a counter coupled to receive the VLF clock signal and configured to toggle an output of the counter upon counting a predetermined number of cycles of the VLF clock signal, wherein the output of the counter is coupled to the first data input of the MUX,
   wherein the MUX is configured to provide the first data input as the output of the MUX during a low power mode, and otherwise to provide the second data input as the output of the MUX, and wherein, during interruption of the low power mode, the counter is configured to maintain a same count value until low power mode is re-entered.

2. The integrated circuit of claim 1, wherein the frequency of VLF clock signal is at least $10^6$ times slower than the frequency of the high frequency clock signal.

3. The integrated circuit of claim 1, wherein the control input of the MUX is coupled to receive a high power mode enable signal which, when asserted, enables a high power mode.

4. The integrated circuit of claim 3, wherein an enable input of the VLF clock is coupled to receive a low power mode enable signal which, when asserted, enables the lower power mode.

5. The integrated circuit of claim 3, wherein during the high power mode, the MUX is configured to provide the second data input as the output of the MUX.

6. The integrated circuit of claim 1, wherein the digital logic circuit comprises a chain of series connected inverters.

7. The integrated circuit of claim 6, further comprising a masking gate coupled to an output of the chain of series connected inverters which is configured to mask toggling of the output of the chain of series connected inverters during the low power mode.

8. The integrated circuit of claim 1, wherein, during the low power mode, when the counter output is at a first logic level, stress is placed on a first set of transistors of the digital logic circuit.

9. The integrated circuit of claim 8, wherein, during the low power mode, when the counter output is at a second logic level, stress is placed on a second set of transistors of the digital logic circuit, wherein the first set and second set of transistors are mutually exclusive.

10. The integrated circuit of claim 8, wherein, during the low power mode, when the counter output is at a first logic level, the second set of transistors recovers from stress and when the counter output is at the second logic level, the first set of transistors recovers from stress.

11. The integrated circuit of claim 1, wherein, during the low power mode, in the absence of a varying input signal at the input of the digital logic circuit, states of the digital logic circuit remains static.

12. The integrated circuit of claim 1, wherein the digital logic circuit is characterized as a clock distribution circuit.

13. A method comprising:
   during a high power mode, providing a high frequency clock signal to an input of a digital logic circuit;
   during a lower power mode:
      providing a very low frequency (VLF) clock signal to a counter, wherein the VLF clock signal has a lower frequency than a frequency of the high frequency clock signal by at least 5 orders of magnitude;
      toggling an output of the counter upon counting a predetermined number of cycles of the VLF clock signal;
      providing the output of the counter to the input of the digital logic circuit instead of the high frequency clock signal;
      interrupting the low power mode, wherein during the interruption, the counter maintains a count value present in the counter when the interruption occurred; and
      after interrupting the low power mode, re-entering the low power mode and continuing to count cycles of the VLF clock signal starting from the maintained count value.

14. The method of claim 13, wherein during the high power mode, disabling the counter from counting cycles of the VLF clock signal.

15. The method of claim 13, wherein, during the lower power mode, when the output of the counter has a first logic level, stress is placed on a first set of transistors of the digital logic circuit, and when the output of the counter has a second logic level different from the first logic level, stress is placed on a second set of transistors of the digital logic circuit, wherein the first set and second set of transistors are mutually exclusive.

16. The method of claim 15, wherein, during the low power mode, when the output of the counter is at a first logic level, the second set of transistors recovers from stress and when the output of the counter is at the second logic level, the first set of transistors recovers from stress.

17. An integrated circuit, comprising:
a digital logic circuit;
a multiplexer (MUX) having a first data input, a second data input coupled to receive a high frequency clock signal, a control input, and an output, wherein:
the output of the MUX is coupled to an input of the digital logic circuit, and
the MUX is configured to provide the first data input as the output of the MUX during a low power mode and the second data input as the output of the MUX during a high power mode;
a very low frequency (VLF) clock configured to provide a VLF clock signal when in the low power mode, wherein the VLF clock signal has a frequency that is at least 5 orders of magnitude less than a frequency of the high frequency clock signal; and
a counter coupled to receive the VLF clock signal and configured to toggle an output of the counter during the lower power mode upon counting a predetermined number of cycles of the VLF clock signal, wherein the output of the counter is coupled to the first data input of the MUX, and wherein when an interruption of the low power mode occurs, the counter is configured to maintain a count value during the interruption such that upon re-entering the low power mode, the counter is configured to continue counting from the maintained count value.

18. The integrated circuit of claim 17, wherein, during the low power mode, when the counter output is at a first logic level, stress is placed on a first set of transistors of the digital logic circuit, and when the counter output is at a second logic level, different from the first logic level, stress is placed on a second set of transistors of the digital logic circuit, wherein the first set and second set of transistors are mutually exclusive.

* * * * *